US006818526B2

(12) United States Patent
Mehrad et al.

(10) Patent No.: US 6,818,526 B2
(45) Date of Patent: Nov. 16, 2004

(54) METHOD FOR MOAT NITRIDE PULL BACK FOR SHALLOW TRENCH ISOLATION

(75) Inventors: Freidoon Mehrad, Plano, TX (US); Zhihao Chen, Plano, TX (US); Juanita Deloach, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/263,511

(22) Filed: Oct. 2, 2002

(65) Prior Publication Data

US 2004/0067620 A1 Apr. 8, 2004

(51) Int. Cl.[7] .................. H01L 21/336; H01L 21/76; H01L 21/461; H01L 21/302
(52) U.S. Cl. .................. 438/424; 438/296; 438/435; 438/692; 438/706
(58) Field of Search ..................... 438/424, 296, 438/435, 692, 706

(56) References Cited

U.S. PATENT DOCUMENTS

| 5,159,428 A | 10/1992 | Rao et al. ............. 357/49 |
| 5,294,563 A | 3/1994 | Rao ..................... 437/69 |
| 5,298,451 A | 3/1994 | Rao ..................... 437/70 |
| 5,369,051 A | 11/1994 | Rao et al. ............. 437/69 |
| 5,506,168 A * | 4/1996 | Morita et al. ........... 438/424 |
| 5,521,422 A * | 5/1996 | Mandelman et al. ....... 257/510 |
| 5,608,256 A | 3/1997 | Rao ................... 257/510 |
| 6,020,621 A | 2/2000 | Wu .................... 257/506 |
| 6,040,232 A * | 3/2000 | Gau ................... 438/424 |
| 6,074,932 A | 6/2000 | Wu .................... 438/435 |
| 6,080,637 A * | 6/2000 | Huang et al. ........... 438/424 |
| 6,121,113 A * | 9/2000 | Takatsuka et al. ........ 438/424 |
| 6,265,286 B1 | 7/2001 | Boyer et al. ............ 438/443 |
| 6,271,143 B1 * | 8/2001 | Mendicino ............. 438/700 |
| 6,297,130 B1 | 10/2001 | Rao ................... 438/444 |
| 6,541,382 B1 * | 4/2003 | Cheng et al. ............ 438/692 |

* cited by examiner

Primary Examiner—John F. Niebling
Assistant Examiner—Ron Pompey
(74) Attorney, Agent, or Firm—Jacqueline J. Garner; W. James Brady, III; Frederick J. Telecky, Jr.

(57) ABSTRACT

A method of fabricating a shallow trench isolation structure includes forming outwardly of a semiconductor layer a first oxide layer. A nitride layer is formed outwardly of the first oxide layer. A second oxide layer is formed outwardly of the nitride layer. A trench is formed through the first oxide layer, the nitride layer, and the second oxide layer and into the semiconductor layer. With the second oxide layer protecting an upper surface of the nitride layer, the nitride layer is etched to form a lateral recessed side boundary of the trench at the nitride layer. The shallow trench isolation layer is formed in the trench.

7 Claims, 3 Drawing Sheets

METHOD FOR MOAT NITRIDE PULL BACK FOR SHALLOW TRENCH ISOLATION

TECHNICAL FIELD OF THE INVENTION

This invention relates generally to the field of integrated circuit fabrication, and more particularly to a method for moat nitride pull back for shallow trench isolation.

BACKGROUND OF THE INVENTION

Modern electronic equipment such as televisions, telephones, radios and computers are generally constructed of solid state devices. Solid state devices are preferred in electronic equipment because they are extremely small and relatively inexpensive. Additionally, solid state devices are very reliable because they have no moving parts, but are based on the movement of charge carriers.

Solid state devices may be transistors, capacitors, resistors, and other semiconductor devices. Typically, such devices are formed in and on a substrate and are interconnected to form an integrated circuit. However, semiconductor components must be properly isolated from one another to function properly. For example, the state and conductance of individual transistors can only be controlled if proper isolation exists among the transistors. If not, leakage currents may occur, causing power dissipation, noise-margin degradation, and voltage shift on dynamic nodes. Additionally, cross talk among transistors can destroy the logic state of a gate.

One way to address these problems are through the formation of shallow trench isolation (STI) structures. STI structures have been used for sub 0.5 micron applications. Typically, a narrow trench is formed in a substrate, and the trench filled with an insulating material ("STI fill"). One problem that has been observed is a tendency of sharp corners or divots to form in the trench isolation material during subsequent etching, deglazing, or other processes subsequent to STI fill.

One method that has been developed for addressing this problem is moat nitride pull back. Moat nitride pull back involves lateral recessing the edge of the moat nitride layer at an isolation trench with a phosphoric acid etch or another suitable process before filling of the trench with isolation material, such that lateral recesses or cavities at the upper corners of the isolation trench may be formed. Isolation material may fill these lateral recesses as well as the trench, thus allowing the deposited isolation material to extend upward and outward from the isolation trench. By allowing the isolation material to extend upward and outward from the trench, the tendency of sharp corners or oxide divots to form in the trench isolation material during subsequent etching, deglazing, or other processes may be reduced.

SUMMARY OF THE INVENTION

The present invention provides a method for moat nitride pull back for shallow trench isolation that substantially eliminates or reduces disadvantages and problems associated with prior systems and methods.

In accordance with one embodiment of the present invention, a method of fabricating a shallow trench isolation structure includes forming outwardly of a semiconductor layer a first oxide layer. A nitride layer is formed outwardly of the first oxide layer. A second oxide layer is formed outwardly of the nitride layer. A trench is formed through the first oxide layer, the nitride layer, and the second oxide layer and into the semiconductor layer. With the second oxide layer protecting an upper surface of the nitride layer, the nitride layer is etched to form a lateral recessed side boundary of the trench at the nitride layer. The shallow trench isolation layer is formed in the trench.

Technical advantages of the present invention include an improved method of moat nitride pull back for STI. The presence of the oxide layer during moat pull back may allow for more control over the moat nitride pull back process.

Another technical advantage of the present invention includes the reduction in the number of deglazing steps required for transistor manufacture. In accordance with various embodiments of the present invention, the formation of oxy-nitride on the nitride layer is reduced or eliminated, thus reducing or eliminating the need for a separate deglaze step to remove oxy-nitride from the nitride layer.

Another technical advantage of the present invention includes a reduction in thickness variation in the nitride layer, resulting in better control over, and less potential damage from, chemical-mechanical polishing. In traditional methods, etching of the nitride for moat nitride pull back will remove part of the top of the nitride layer, exacerbating thickness variations in the nitride. In accordance the present invention, the oxide layer may protect the surface of the nitride during nitride pull back, thus reducing or eliminating nitride thickness variations resulting from the pull back step.

Certain embodiments may possess none, one, some, or all of these technical features and advantages and/or additional technical features and advantages. Other technical advantages will be readily apparent to one skilled in the art from the following figures, description, and claims.

BRIEF DESCRIPTION OF THE DRAWINGS

For a more complete understanding of the present invention and its advantages, reference is now made to the following description, taken in conjunction with the accompanying drawings, in which.

DETAILED DESCRIPTION OF THE INVENTION

FIGS. 1A–1F are a series of schematic cross-sectional diagrams illustrating a method of fabricating an STI structure in accordance with one embodiment of the present invention. STI structures may be used to isolate transistors and other components of the integrated circuit from one another.

Figure 1A:
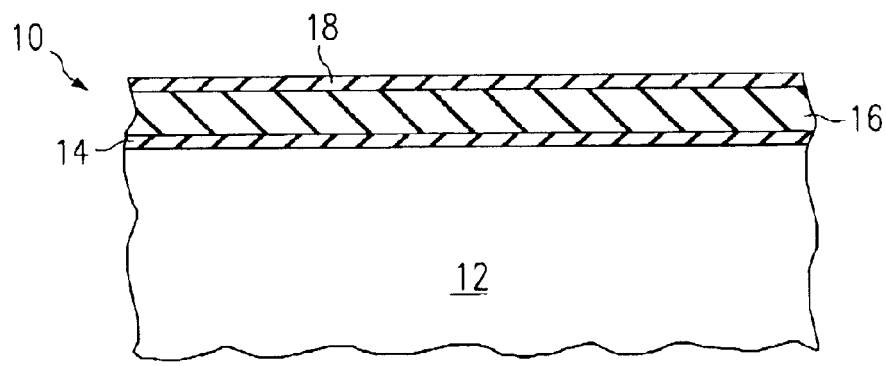
FIGS. 1A–1J are a series of schematic cross-sectional diagrams illustrating an trench isolation process using moat nitride pull back in accordance with one embodiment of the present invention.

FIG. 1A illustrates an initial semiconductor structure 10 for constructing an isolation trench in accordance with one embodiment of the present invention. The initial semiconductor structure 10 may comprise a semiconductor layer 12. In one embodiment, the semiconductor layer 12 may comprise silicon. It will be understood that the semiconductor layer 12 may comprise other types of semiconductor material.

The semiconductor layer 12 may be a substrate such as a wafer. It will be understood that the semiconductor layer 12 may also be a layer of semiconductor material formed on a substrate. For example, the semiconductor layer 12 may be an epitaxial layer grown on a wafer.

A first, or pad, oxide layer 14 may be formed on the surface of the semiconductor layer 12. The pad oxide layer 14 may comprise silicon dioxide deposited or thermally grown on the surface of the semiconductor layer 12 in accordance with conventional techniques. In one embodiment, the pad oxide layer 14 may be 100–150 angstroms thick. A nitride layer 16 may be formed on the oxide layer 14. The nitride layer 16 may be silicon nitride deposited on the oxide layer 14 in accordance with conventional techniques. The nitride layer 16 may be 1000–2000 angstroms thick or another suitable thickness. As described in more detail below, the nitride layer 16 may form a polish stop for later mechanical polishing of trench isolation material.

A second, or cap, oxide layer 18 may be formed on the surface of the nitride layer 16. Cap oxide layer 18 may comprise silicon dioxide deposited on the surface of the nitride layer 16 using deposition or another suitable technique. In one embodiment, cap oxide layer 18 may be 100–300 angstroms thick.

Figure 1B:
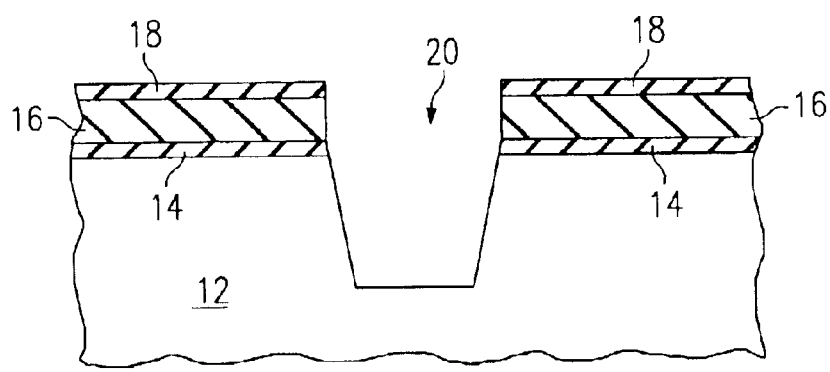

Referring to FIG. 1B, a trench 20 may be formed in the semiconductor layer 12. The trench 20 may be formed by masking active areas of the device with a patterned etch mask and then plasma etching the nitride layer 16, oxide layer 14 and semiconductor layer 12 with chlorine-based chemistry. The patterned etch mask may then be removed. In a particular embodiment, trench 20 may have dimensions of approximately 0.1 to 0.3 Microns. It will be understood that the trench 20 may be otherwise formed without departing from the scope of the present invention.

Figure 1C:
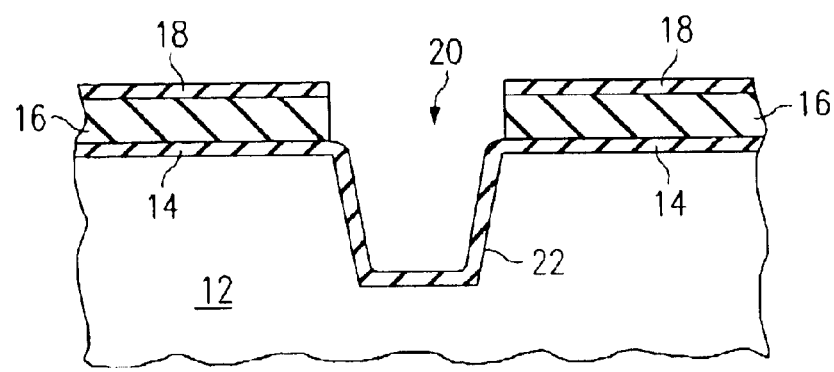

Referring to FIG. 1C, a sacrificial oxide layer 22 may be formed along the trench 20. The sacrificial oxide layer 22 may protect the silicon surface from loss or roughening during the hot phosphoric acid process for moat nitride pull back. In one embodiment, the sacrificial oxide layer 22 may comprise a thermal oxide grown on the base and side walls of the trench 20. The thermal oxide may in a particular embodiment be grown in a furnace under dry conditions at a temperature of about 800° C. In the furnace, the semiconductor structure may be exposed to ambient gas comprising oxygen. In one embodiment, the sacrificial oxide layer 22 may have a thickness of between 30 and 60 angstroms. Formation of the sacrificial oxide layer in this manner may result in little or no oxide formation on the moat nitride due to low formation temperature and thickness.

Figure 1D:
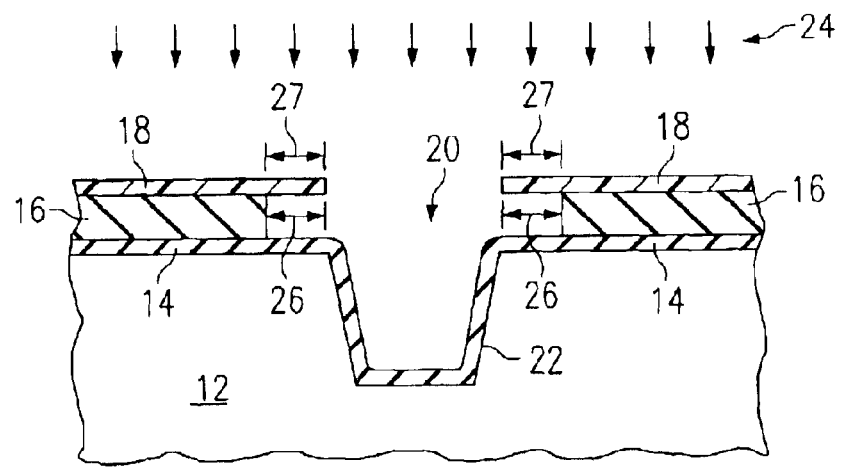

Referring to FIG. 1D, moat nitride pull back is accomplished. Moat nitride pull back involves forming recesses 26 at the edge of the nitride with a phosphoric acid etch or another suitable process before filling of the trench with isolation material, lateral recesses or cavities at the upper corners of the isolation trench may be formed. Isolation material may fill recesses 26 as well as the trench, thus allowing the deposited isolation material to extend upward and outward from the isolation trench. By allowing the isolation material to extend upward and outward from the trench, the tendency of sharp corners or divots to form in the trench isolation material during subsequent etching, deglazing, or other processes may be reduced.

In a particular embodiment, nitride pull back is accomplished by wet etching 24 using an agent such as hot phosphorous. In an alternative embodiment, a plasma or other dry etch process may be used for nitride pull back. Other suitable processes may be used. In a particular embodiment, the width 27 of each recess 26 may be approximately 200–400 angstroms.

Sacrificial oxide layer 22 may prevent silicon loss and roughening of the silicon surface during nitride pull back. Cap oxide layer 18 may protect the surface of the nitride layer 16 during nitride pull back, allowing for the maintaining of a substantially uniform thickness of the nitride layer 16. In a particular embodiment, a substantially uniform thickness may mean a variation of no more than 5% in the thickness of nitride layer 16. In addition, by limiting the extent of pull back, oxide layer 18 may allow for the more control over the extent of moat nitride pull back.

Figure 1E:
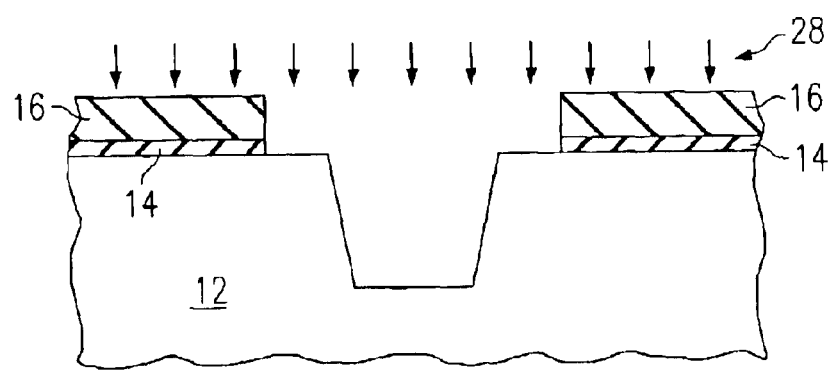

Referring to FIG. 1E, deglazing 28 may remove cap oxide 18 and also the sacrificial oxide layer 22. Deglazing 28 may be accomplished via hydrofluoric acid treatment or another suitable process. Cap oxide 18 and or sacrificial oxide layer 22 may be otherwise suitably removed.

Traditional methods of moat nitride pull back include etching of the nitride layer, and etching is usually done after an STI oxide liner growth. However, in such traditional methods, since the moat nitride is exposed during the oxide liner growth, an oxy-nitride layer may be formed on top of the nitride layer. This oxy-nitride layer may, in traditional methods, need to be deglazed from vertical and horizontal moat nitride surfaces prior to the moat nitride pullback process, resulting in unwanted removal of the oxide liner. The teachings of the present invention recognize that the covering of the horizontal surface of nitride layer 16 by the cap oxide 18 during moat nitride pullback, and/or the formation of the sacrificial oxide layer under relatively low temperature conditions (about 800° C., as described above), may reduce or eliminate the formation of oxynitride on the nitride layer. Thus, in accordance with various embodiments of the present invention, the need for a separate deglaze step to remove oxy-nitride from the nitride layer may be reduced or eliminated.

Figure 1F:
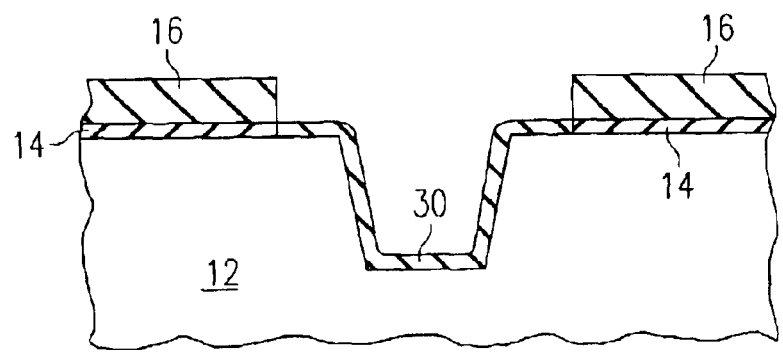

Referring to FIG. 1F, a second oxide liner 30 is formed. Second oxide liner 30 may in one embodiment have a thickness of approximately 50 to 200 angstroms and may be formed similarly to sacrificial oxide layer 22 or via another suitable process. Second oxide liner 30 may in a particular embodiment provide a surface for isolation material 32 (described below) to readily adhere to. In a particular embodiment, the processes of formation and removal of oxide liners may have a tendency to round sharp edges or corners within trench 20. In a particular embodiment, the steps of formation, removal, and reformation of oxide liners may be repeated a number of times so as to improve corner rounding.

Figure 1G:
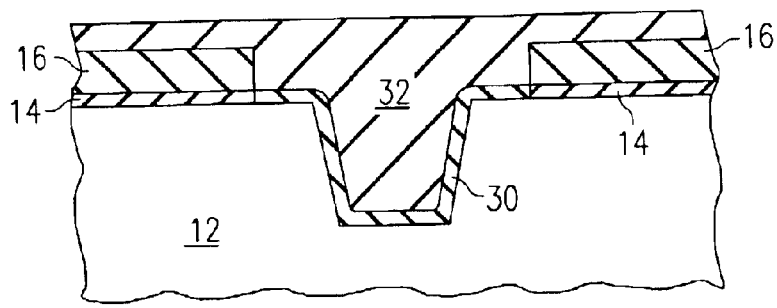

Referring to FIG. 1G, isolation material 32 may be deposited to fill the trench 20. Isolation material 32 may comprise HDP oxide or another suitable dielectric material. Isolation material 32 fills trench 20, including recesses 26.

Figure 1H:
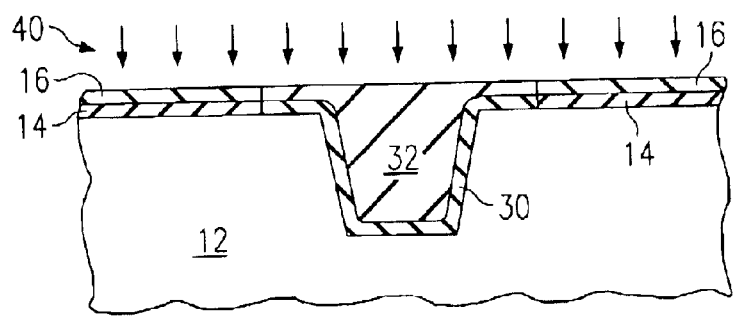

Referring to FIG. 1H, a chemical-mechanical polish (CMP) process 40 is utilized to remove excess isolation material. The nitride layer 16 may act as a polish stop, and in doing so a top portion of the nitride layer 16 is removed as well. As noted above, in particular embodiments of the present invention, variations in the thickness of nitride layer 16 may be reduced or minimized. As a result, damage to the circuit during CMP process may also be reduced or minimized.

Figure 1I:
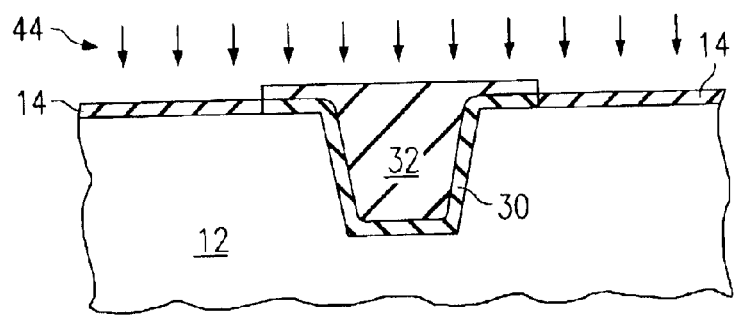

Referring to FIG. 1I, the nitride layer 16 may then be removed from pad oxide layer 14 with a phosphoric acid etch, a selective plasma etch, or similar process 44. A portion of the insulation material 32 may protrude above and outward from the trench after removal of the nitride layer 16.

Figure 1J:
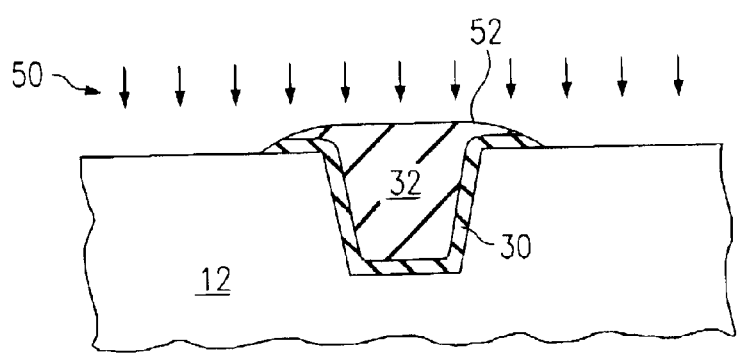

Referring to FIG. 1J, pad oxide layer 14 may be removed from the substrate 12 with a hydrofluoric acid deglaze or a similar process 50. The resulting STI structure 52 may be used to isolate transistors and other components of the integrated circuit from one another.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the scope of the appended claims.

What is claimed is:

1. A method of fabricating an integrated circuit, comprising:

forming outwardly of a semiconductor layer a first oxide layer;

forming outwardly of the first oxide layer a nitride layer;

forming outwardly of the nitride layer a second oxide layer, forming a trench through the first oxide layer, the nitride layer, and the second oxide layer and into the semiconductor layer;

forming a sacrificial oxide layer in the trench;

with the second oxide layer protecting an upper surface of the nitride layer, etching the nitride layer to form a recessed side boundary of the trench at the nitride layer;

removing the second oxide layer and the sacrificial liner; and then, forming the shallow trench isolation layer in the trench.

2. The method of claim 1, wherein the step of forming a sacrificial oxide layer in the trench comprises thermal oxidation at a temperature of about 800° C.

3. The method of claim 2, further comprising: chemically-mechanically polishing the nitride layer and the shallow trench isolation layer.

4. An integrated circuit, formed by a method comprising:

forming outwardly of a semiconductor layer a nitride layer;

forming outwardly of the nitride layer an oxide layer;

forming a trench through the nitride layer and the oxide layer and into the semiconductor layer;

forming a sacrificial oxide layer in the trench;

with the oxide layer protecting an upper surface of the nitride layer, etching the nitride layer to form a recessed side boundary of the trench at the nitride layer;

removing the oxide layer and the sacrificial oxide layer; and then, forming a shallow trench isolation layer in the trench.

5. The integrated circuit of claim 4, the method further comprising removing the nitride layer.

6. The integrated circuit of claim 5, the method further comprising chemically-mechanically polishing the nitride layer and the shallow trench isolation layer before removing the nitride layer.

7. A method of fabricating a shallow trench isolation structure, comprising:

forming outwardly of a semiconductor layer a first oxide layer;

forming outwardly of the first oxide layer a nitride layer;

forming outwardly of the nitride layer a second oxide layer;

forming a trench through the first oxide layer, the nitride layer, and the second oxide layer and into the semiconductor layer;

forming a sacrificial liner in the trench with the second oxide layer protecting an upper surface of the nitride layer, etching the nitride layer to form a recessed side boundary of the trench at the nitride layer;

removing the second oxide layer and sacrificial liner;

then, forming a trench liner;

then, forming the shallow trench isolation layer in the trench;

chemically-mechanically polishing the nitride layer and the shallow trench isolation layer; and removing the nitride layer.

* * * * *